United States Patent [19]

Kon

[11] Patent Number: 4,599,637
[45] Date of Patent: Jul. 8, 1986

[54] SOLID STATE IMAGING DEVICE WITH PHOTOCONDUCTIVE LAYER

[75] Inventor: Takao Kon, Tokyo, Japan

[73] Assignee: Tokyo Shibaura Denki Kabushiki Kaisha, Kawasaki, Japan

[21] Appl. No.: 604,196

[22] Filed: Apr. 26, 1984

[30] Foreign Application Priority Data

Apr. 26, 1983 [JP] Japan ............................ 58-72091

[51] Int. Cl.⁴ .................... H01L 27/14; H01L 31/00; H01L 29/78
[52] U.S. Cl. .......................................... 357/30; 357/24
[58] Field of Search .................... 357/16, 24, 30, 31

[56] References Cited

U.S. PATENT DOCUMENTS

| | | |
|---|---|---|
| 4,236,829 | 12/1980 | Chikamura et al. ........... 357/24 LR |
| 4,271,240 | 6/1981 | Chikamura et al. ........... 357/30 |
| 4,323,912 | 4/1982 | Kolke et al. .................. 357/24 LR |
| 4,360,821 | 11/1982 | Tsukada et al. ............... 357/30 |
| 4,462,047 | 7/1984 | Fujimoto et al. ............. 357/24 LR |

Primary Examiner—Gene M. Munson
Attorney, Agent, or Firm—Cushman, Darby & Cushman

[57] ABSTRACT

A solid state imaging device having a semiconductor substrate including charge storage sections and charge transferring sections, a photoconductive layer provided on the semiconductor substrate, and a transparent electrode formed on the photoconductive layer. After transferring the charges in the charge storage sections to the charge transferring sections, the transparent electrode is applied with high voltage to release trapped charges at the trap level of the photoconductive layer. Thereby highlight image lag can be reduced.

3 Claims, 6 Drawing Figures

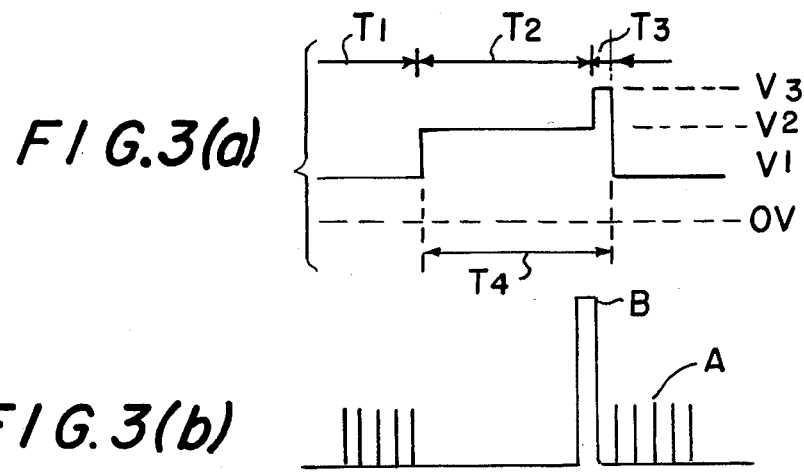
FIG.3(a)
FIG.3(b)
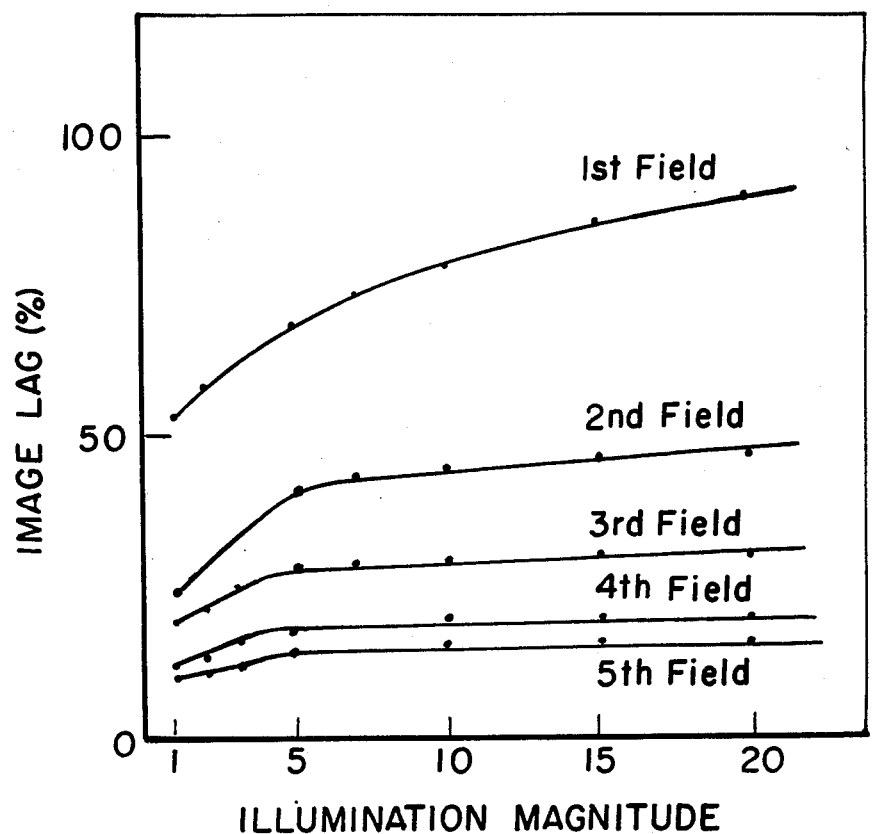
FIG.4

SOLID STATE IMAGING DEVICE WITH PHOTOCONDUCTIVE LAYER

BACKGROUND OF THE INVENTION

The present invention relates to a solid state imaging devices. More specifically, the present invention provides a novel structure for a solid state imaging device having the advantageous feature of reducing highlight image lag.

Conventionally, solid state imaging devices include photosensitive sections and signal charge transferring sections formed on a semiconductor substrate. The charge transferring sections are positioned adjacent to the photosensitive sections. The photosensitive sections must be made narrow, because it is necessary to position the signal charge transferring sections adjacent thereto. This causes the light utility factor and sensitivity of the the device to be low. Charges are generated in the semiconductor substrate except in photosensitive sections irradiated by a strong light, and these charges leak into the charge transferring sections. This phenomenon causes image smear.

To eliminate this drawback, there was developed a solid state imaging device having a silicon substrate including charge transferring sections and charge storage sections with a photoconductive layer provided on the silicon substrate. Such an arrangement is described in U.S. Pat. No. 4,360,821 which is incorporated herein by reference as if fully reproduced. This type of imaging device has high sensitivity, low blooming and low smear characteristics. Further, special sensitivity of the device can be controlled by selecting a particular type of photoconductive layer.

The known solid state imaging device having a photoconductive layer, as described above, has many advantages over imaging devices not having a photoconductive layer. However, it has a significant operational disadvantage. It exhibits the peculiarly undesirable phenomenon of image lag which occurs by virtue of the photoconductive layer itself. This phenomenon is particularly noticeable when a bright moving object is imaged, the image appearing to have a long tail which degrades image quality. This phenomenon is so called highlight image lag and to date this problem has not been dealt with adequately.

SUMMARY OF THE INVENTION

An object of the present invention is to provide a solid state imaging device that exhibits less highlight image lag than known devices.

The solid state imaging device according to the present invention includes: a semiconductor substrate having charge storage sections and charge transferring sections; a photoconductive layer convering incident light into signal charge provided on the semiconductor substrate; a transparent electrode provided on the photoconductive layer; a means for applying a voltage to the transparent electrode after the signal charges in the storage sections being transferred to the charge transferring sections, the voltage being enable to release the trapped charge to the transparent electrode, and a clock generating reading pulses enabling to transfer the signal charge in the storage sections to the transferring sections.

BRIEF DESCRIPTION OF THE DRAWINGS

The invention will be described in detail with reference to the accompanying drawings, wherein:

FIGS. 3(a) and 3(b) are timing charts of driving pulses in the imaging device of the present invention;

FIG. 4 is a graph showing image lag characteristics of another prior art imaging device.

DETAILED DESCRIPTION OF THE PRESENT INVENTION

Figure 1:
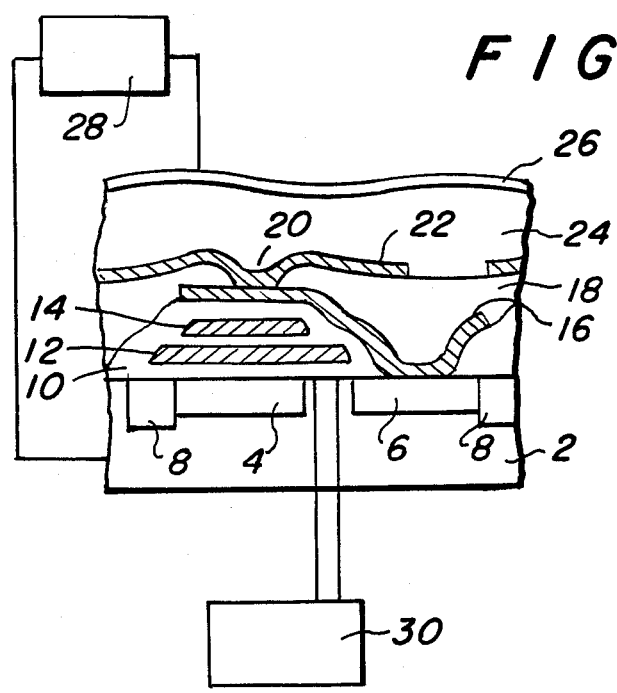
FIG. 1 is a cross-sectional view of a solid state imaging device of the present invention.

Referring now to FIG. 1, there is shown a cross-sectional view of the solid state image pickup device according to the present invention. This device utilizes a CCD (Charge Coupled Device) as a scanning substrate. A p+-type silicon substrate 2 has first n+-type regions 4 as charge transfer sections and second n+-type regions 6 as charge storage sections positioned adjacent to the first n+-type region 4. The p+-type regions 8 are provided adjacent to the first and second regions 4 and 6 as channel stoppers. Gate electrodes 12 and 14 are provided on first n+-type regions 4 through a insulative layer 10. Metal electrodes 16 are provided on second n+-type regions 6. On metal electrodes 16, a flattening layer 18 made of insulative material is formed to flatten an uneven surface of insulative layer 10 and metal electrodes 16. On a flattening layer 18, pixel electrodes 22 are formed to contact electrodes 16 through holes 20 and a photoconductive layer 24, for example amorphous silicon, is formed. The photoconductive layer 24 is provided for opto-electric conversion and charge storage. A transparent electrode 26, for example made of indium tin oxide, is formed on photoconductive layer 24. A DC voltage of 0 to 1.5 volts is applied to transparent electrode 26 by a power source 28 for transparent electrode 24. A clock 30 generates reading pulses and transferring pulses which are applied to electrodes 12 and 14.

In this device, highlight image lag can be recognized when bright light irradiates the photoconductive layer. Highlight image lag will be explained below.

Figure 2:
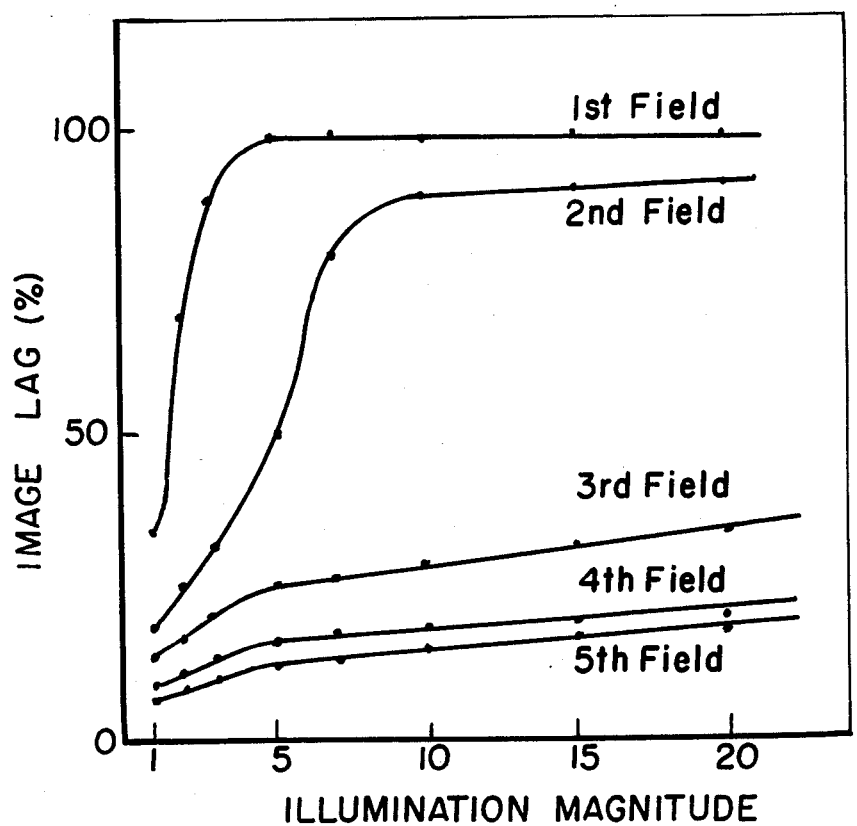
FIG. 2 is a graph showing image lag characteristics of the solid state imaging device of the prior art.

FIG. 2 shows image lag characteristics corresponding to quantity of the incident light. The horizontal axis of FIG. 2 denotes a quantity of the incident light and the vertical axis denotes a quantity of an image lag. The horizontal axis is normalized by the incident light quantity of saturated level. Image lag decreases with increasing quantity of incident light in the range under the saturated light quantity level, that is, light quantity magnitude 1 on the horizontal axis. However, image lag increases with increasing quantity of incident light in range of quantity magnitude 1 to 10 on the horizontal axis. The output of each scanning field is approximately constant in the region above light quantity magnitude 10 of saturation level. This phenomenon is so called highlight image lag. The causes of image lag are discussed below.

(1) An incomplete transfer mode causes image lag. Charges in the second n+-type regions of charge storage sections are not transferred perfectly to the first n+-type regions of charge transfer sections.

(2) The capacitance of the photoconductive layer causes image lag.

(3) In case the maximum quantity of transferable charges by the first n+-type region is smaller than quantity of charges generated in the opto-electric conversion sections, excess charges are left in the opto-electric conversion sections, and this causes an image lag.

(4) Part of the signal charges are trapped in fthe photoconductive layer. These trapped charges cause image lag.

The phenomena discussed at (1) and (2), above, mainly cause normal image lag, and the phenomena of items (3) and (4) cause highlight image lag. Using the arrangement of the present invention, excess charge and signal charge trapped in the photoconductive layer are decreased with respect to known structural arrangement.

Now the operation of the present invention will be explained. FIG. 3(a) shows a timing charge of pulses applied to the transparent electrode and FIG. 3(b) shows a timing chart of pulses applied to the gate electrodes. In FIG. 3(b) "A" denotes transferring pulses and "B" denotes a reading pulse, respectively. The period $T_1$ is a charge storage period, and during this period the transparent electrode 26 is applied with a voltage of $V_1$. The voltage $V_1$ is a higher voltage than that of second n+-type region 6, which voltage causes a MOS transistor switch (including first and second n+-type regions 4 and 6 and gate electrode 12) to turn "ON" during the charge transferring period. Therefore, even in the presence of strong light, the voltage of second n+-type region 6, which is decreased by the generated signal charges, does not lower to a lower voltage than that of $V_1$. Thus, the leakage of charge to first n+-type region 4 of transferring section is eliminated, and blooming is suppressed. The value of $V_1$ is, for example, 1.5 volts.

Next, the voltage applied to transparent electrode 26 in a vertical blanking period $T_4$ will be explained. The voltage of $V_2$ higher than the voltage of $V_1$ is applied to the transparent electrode 26 during the period $T_2$. The voltage of $V_2$ is the value which drains excess signal charges. The excess charges are those which cannot be handled in the transferring sections. The voltage $V_2$ is, for example, 5 volts. During $T_2$, reading pulse B is applied to the gate electrode, and signal charges are transferred to the transfer sections from signal charge sections. Thus signal charges below the maximum quantity of transferable charges are left in the charge storage sections caused by $V_2$, and thereby after reading pulse, excess charge cannot be left in the storage sections.

FIG. 4 shows image lag characteristics when $V_2$ is applied to the transparent electrode 26 during the vertical blanking period $T_4$.

With the arrangement discussed above, image lag is reduced remarkably. However, it is not adequate. Part of the signal charges in the photoconductive layer generated by strong incident light are trapped at the trap level of the photoconductive material. More charges are trapped on the side of the photoconductive layer near the transparent electrode than on the other side of the photoconductive layer. These trapped charges will be released after a long time and they cause an image lag.

According to the present invention, after reading pulse "B" the voltage $V_3$ is applied to the transparent electrode to release the trapped charge to the transparent electrode during period $T_3$. The voltage of $V_3$ is higher than the voltage of $V_2$. The voltage $V_3$ is, for example, about 10 volts.

Figure 5:
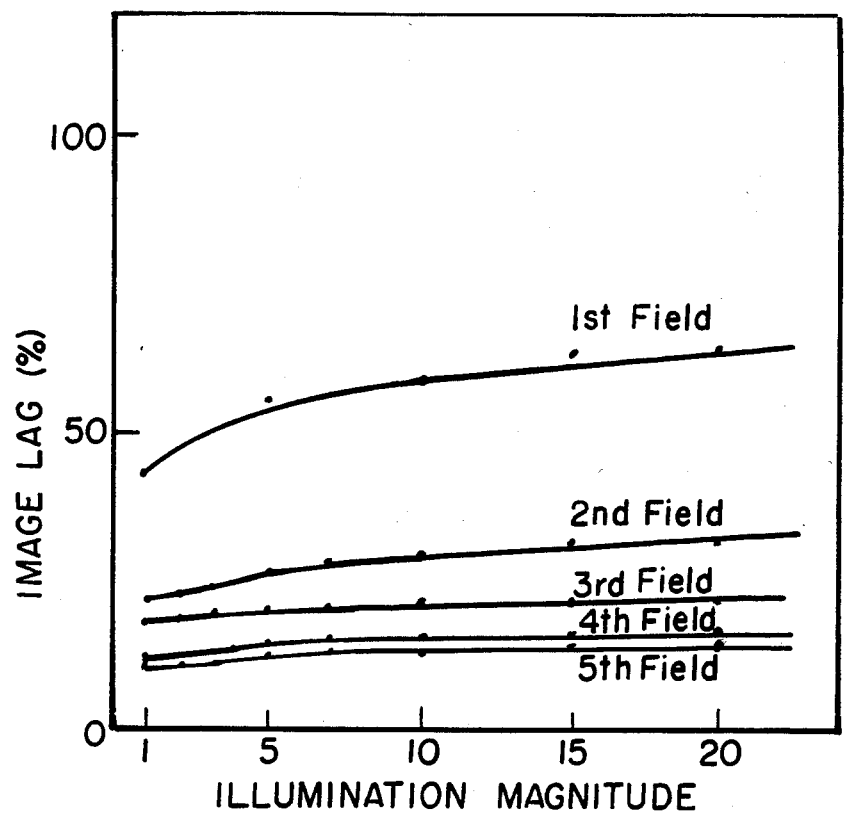
FIG. 5 is a graph showing image lag characteristics of the present invention.

FIG. 5 shows the image lag characteristics of the present invention. Compared to FIG. 4, it is apparent that image lag is remarkably reduced in the present invention. Particularly, image lag in the first and second fields are remarkably decreased.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. A solid state imaging device comprising:
   a semiconductor substrate having charge storage sections and charge transferring sections;
   a photoconductive layer provided on said semiconductor substrate for converting incident light into signal charges;
   a transparent electrode provided on said photoconductive layer;
   a means for applying voltage to said transparent electrode after said signal charges in said storage sections are transferred to said charge transferring sections, said voltage causing a release of trapped charges in said photoconductive layer to said transparent electrode; and
   a clock generator for generating reading pulses enabling to transfer said signal charges in said storage sections to said transferring sections.

2. A solid state imaging device according to claim 1, wherein said charge transferring section comprises a charge coupled device (CCD).

3. A solid state imaging device according to claim 1, wherein said photoconductive layer is made of amorphous silicon.

* * * * *